(12) United States Patent
Moon

(10) Patent No.: US 9,570,194 B1
(45) Date of Patent: Feb. 14, 2017

(54) DEVICE FOR DETECTING FUSE TEST MODE USING A FUSE AND METHOD THEREFOR

(71) Applicant: SK hynix Inc., Icheon-si, Gyeonggi-do (KR)

(72) Inventor: Hong Ki Moon, Seoul (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/959,101

(22) Filed: Dec. 4, 2015

(30) Foreign Application Priority Data

Sep. 10, 2015 (KR) ........................ 10-2015-0128083

(51) Int. Cl.
| | | |
|---|---|---|
| *G11C 17/18* | (2006.01) | |
| *G11C 17/16* | (2006.01) | |
| *G11C 29/02* | (2006.01) | |
| *G11C 7/10* | (2006.01) | |
| *G11C 29/00* | (2006.01) | |
| *G11C 7/22* | (2006.01) | |

(52) U.S. Cl.
CPC ............. *G11C 17/18* (2013.01); *G11C 7/1018* (2013.01); *G11C 7/22* (2013.01); *G11C 17/16* (2013.01); *G11C 29/027* (2013.01); *G11C 29/787* (2013.01)

(58) Field of Classification Search
CPC . G11C 2229/763; G11C 29/027; G11C 29/44; G11C 29/4401; G11C 29/787; G11C 2029/4402
USPC ......... 365/96, 189.07, 200, 201, 221, 225.7, 365/230.06
See application file for complete search history.

(56) References Cited

U.S. PATENT DOCUMENTS

| | | | | |
|---|---|---|---|---|
| 5,659,551 A | * | 8/1997 | Huott | G01R 31/318385 714/53 |
| 5,901,105 A | * | 5/1999 | Ong | G11C 5/025 365/230.03 |
| 5,999,480 A | * | 12/1999 | Ong | G11C 5/025 365/230.03 |
| 6,091,649 A | * | 7/2000 | Choi | G11C 29/72 365/200 |
| 2014/0269109 A1 | | 9/2014 | Kong | |
| 2015/0100850 A1 | | 4/2015 | Lee et al. | |

* cited by examiner

*Primary Examiner* — Gene Auduong
(74) *Attorney, Agent, or Firm* — William Park & Associates Ltd.

(57) ABSTRACT

A fuse test mode detection device is disclosed, which relates to a technology for improving detection efficiency of a fuse test mode. The fuse test mode detection device includes: a fuse unit configured to scan a plurality of fuses in a boot-up operation, and output fuse data; a counter configured to count the fuse data in response to a clock signal; a decoding unit configured to output a decoding signal for controlling a fuse test mode in response to an output signal of the counter; an encoder configured to encode the output signal of the decoding unit, and output a code signal; and a comparator configured to compare the fuse data with the code signal, and output a comparison signal.

19 Claims, 2 Drawing Sheets

DEVICE FOR DETECTING FUSE TEST MODE USING A FUSE AND METHOD THEREFOR

CROSS-REFERENCE TO RELATED APPLICATION

This application claims priority based upon Korean patent application No. 10-2015-0128083, filed on Sep. 10, 2015, the disclosure of which is hereby incorporated in its entirety by reference herein.

BACKGROUND OF THE INVENTION

1. Technical Field

Embodiments of the present disclosure relate to a fuse test mode detection device, and more particularly to a technology for improving detection efficiency of a test mode of a fuse.

2. Background Art

A Dynamic Random Access Memory (DRAM) includes a plurality of memory cells arranged in a matrix form.

However, if a defective or failed cell occurs in at least one memory cell from among the plurality of memory cells, it is impossible for a semiconductor memory device to normally operate. Thus, the semiconductor memory device having the defective cell is regarded as a defective product and discarded. Because semiconductor memory devices have been developed to have a higher degree of integration at a higher speed, there is a higher possibility of causing defective cells.

As a result, a production yield is gradually reduced. The production yield is denoted by a ratio of a total number of chips to a number of normal chips. The production yield is needed to determine a production cost of DRAMs.

Therefore, in order to increase the production yield of semiconductor memory devices, many developers and companies are conducting intensive research into a method for fabricating highly-integrated semiconductor memory devices configured to operate at a higher speed and a method for efficiently repairing defective cells.

A widely used method for repairing a defective cell involves embedding a repair circuit configured to replace a defective cell with a redundant cell in the semiconductor memory device.

Generally, the repair circuit includes redundant columns/rows in which redundant memory cells are arranged in rows and columns. The repair circuit selects the redundant column/row as a substitute for the defective column/row.

That is, if a row and/or column address signal for designating a defective cell is input to the repair circuit, the repair circuit selects the redundant column/row instead of the defective column/row of a memory cell bank.

In order to recognize an address for designating a defective cell, the semiconductor memory device includes a plurality of fuses capable of being blown, and the fuses are selectively blown so that an address of the defective cell can be programmed.

BRIEF SUMMARY OF THE INVENTION

Various embodiments of the present disclosure are directed to providing a fuse test mode detection device that substantially obviates one or more problems due to limitations and disadvantages of the related art.

Embodiments of the present disclosure relate to a fuse test mode detection device configured to output test mode information of a fuse unit to an external part in such a manner that an external user can monitor the test mode information, resulting in increased efficiency of a fuse test.

In accordance with an embodiment of the present disclosure, a fuse test mode detection device includes: a fuse unit configured to scan a plurality of fuses in a boot-up operation, and output fuse data; a counter configured to count the fuse data in response to a clock signal; a decoding unit configured to output a decoding signal for controlling a fuse test mode in response to an output signal of the counter; an encoder configured to encode the output signal of the decoding unit, and output a code signal; and a comparator configured to compare the fuse data with the code signal, and output a comparison signal.

In accordance with another embodiment of the present disclosure, a method performed by a fuse test mode detection device, the method comprising: scanning, by a fuse unit, a plurality of fuses in a boot-up operation and outputting fuse data; counting, by a counter, the fuse data in response to a clock signal; outputting, by a decoding unit, a decoding signal for controlling a fuse test mode in response to an output signal of the counter; encoding, by an encoder, the output signal of the decoding unit and outputting a code signal; and comparing, by a comparator, the fuse data with the code signal and outputting a comparison signal.

It is to be understood that both the foregoing general description and the following detailed description of the present disclosure are for example and explanatory and are intended to provide further explanation of the invention as claimed.

BRIEF DESCRIPTION OF THE DRAWINGS

The above and other features and advantages of the present disclosure will become readily apparent by reference to the following detailed description when considered in conjunction with the accompanying drawings wherein.

DESCRIPTION OF EMBODIMENTS

Reference will now be made in detail to embodiments of the present disclosure, examples of which are illustrated in the accompanying drawings. Wherever possible, the same reference numbers are used throughout the drawings to refer to the same or like portions. In the following description of the present disclosure, a detailed description of related known configurations or functions incorporated herein may be omitted for clarity of the subject matter of the present disclosure.

Figure 1:
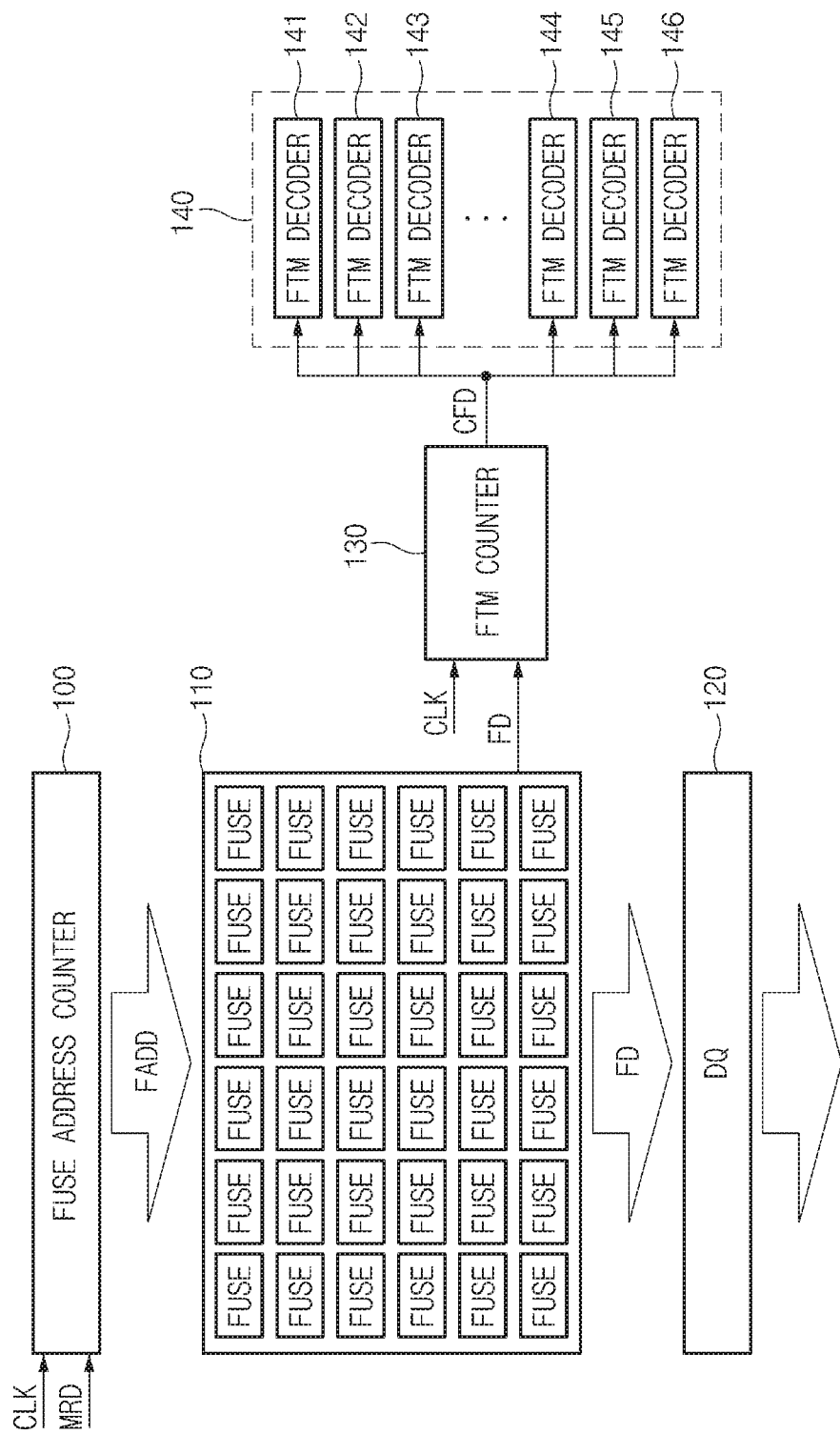
FIG. 1 is a block diagram illustrating a fuse test mode control device according to an embodiment of the present disclosure.

FIG. 1 is a block diagram illustrating a fuse test mode control device according to an embodiment of the present disclosure.

Referring to FIG. 1, the fuse test mode control device may include a fuse address counter 100, a fuse unit 110, an output pad 120, a counter 130, and a decoding unit 140.

The fuse address counter 100 may count memory repair data (MRD) in response to a clock signal CLK, and output a fuse address FADD.

The fuse unit 110 may include a plurality of fuses (FUSEs). The fuse unit 110 may sequentially scan the plurality of fuses (FUSEs) in response to the fuse address FADD, and output fuse data FD. The fuse unit 110 may include an E-fuse array (ARE).

If at least one memory cell contained in a semiconductor device is defective, the semiconductor device having the defective cell is regarded as a defective product and discarded. The higher the memory capacity of a semiconductor device, the greater the chance that the semiconductor device will be regarded as a defective product.

Therefore, the semiconductor device includes redundant cells, such that a repair operation for replacing defective memory cells with redundant cells is performed. In order to perform the repair operation, information about defective memory cells needs to be stored in the semiconductor device.

In order to store information (e.g., information regarding defective memory cells) needed for various internal control operations, the semiconductor device is configured to use the fuse to convey this information. Since a general fuse classifies data according to whether or not the fuse is cut, it is possible to program the fuse in a wafer state. However, after the wafer is packaged, it may not be possible to program the fuse.

In order to address the above-mentioned issues, an electrical fuse (E-fuse) is used. The E-fuse is configured to store data by using a transistor to change a resistance between a gate and a drain/source.

That is, the E-fuse is configured to perform information programming by melting the fuse due to an overcurrent. The E-fuse array (ARE) may be implemented as a plurality of E-fuses arranged in row(s) and column(s) to form an array.

Fuse data FD transferred from a fuse to the output pad 120 may be output externally from the output pad 120. The counter 130 may count fuse data FD received from the fuse unit 110 in response to a clock signal CLK, and the counter 130 may output the counted fuse data CFD to the decoding unit 140. The counter 130 may count the fuse data FD in a fuse test mode (FTM).

The decoding unit 140 may include a plurality of FTM decoders (141~146), also known as internal decoders, configured to output decoding signals upon receiving an output signal of the counter 130. The output signal may be, in one example, the counted fuse data CFD. Decoders contained in the decoding unit 140 may be sequentially enabled in response to the counting signal received from the counter 130. The operation state of the semiconductor memory device is changed in response to an output signal of the decoding unit 140, such that the test operation is achieved.

The fuse test mode control device may change the operation state of the memory device through the fuse test mode (FTM) controlled by the fuse unit 110. In this case, it is necessary to confirm whether or not the fuse test mode (FTM) desired by a user is correctly operated.

It may be possible for the semiconductor memory device to program cell repair information and test mode information through a cutting operation of the fuse unit 110. The fuse data FD may be externally output through the output pad 120. The fuse data FD may indicate repair information of a memory cell through a roll call function for reading information of the fuse unit 110. However, fuse test mode (FTM) information corresponding to the fuse data FD of the fuse unit 110 may not be output externally.

Fuse information is confirmed by detecting memory repair data MRD confirming whether or not the fuse test mode (FTM) is enabled. However, FTM information must be confirmed one at a time, so that a test time is increased and it may be impossible to confirm erroneous FTM information caused by problems other than the fuse.

In addition, the output value of the semiconductor memory device or the change of a current consumed in the semiconductor memory device may be observed so that malfunction information of the FTM can be indirectly confirmed. However, this scheme has a disadvantage in that a test time may be increased and it may be difficult to correct malfunction information separately even though the malfunction information is confirmed.

Figure 2:
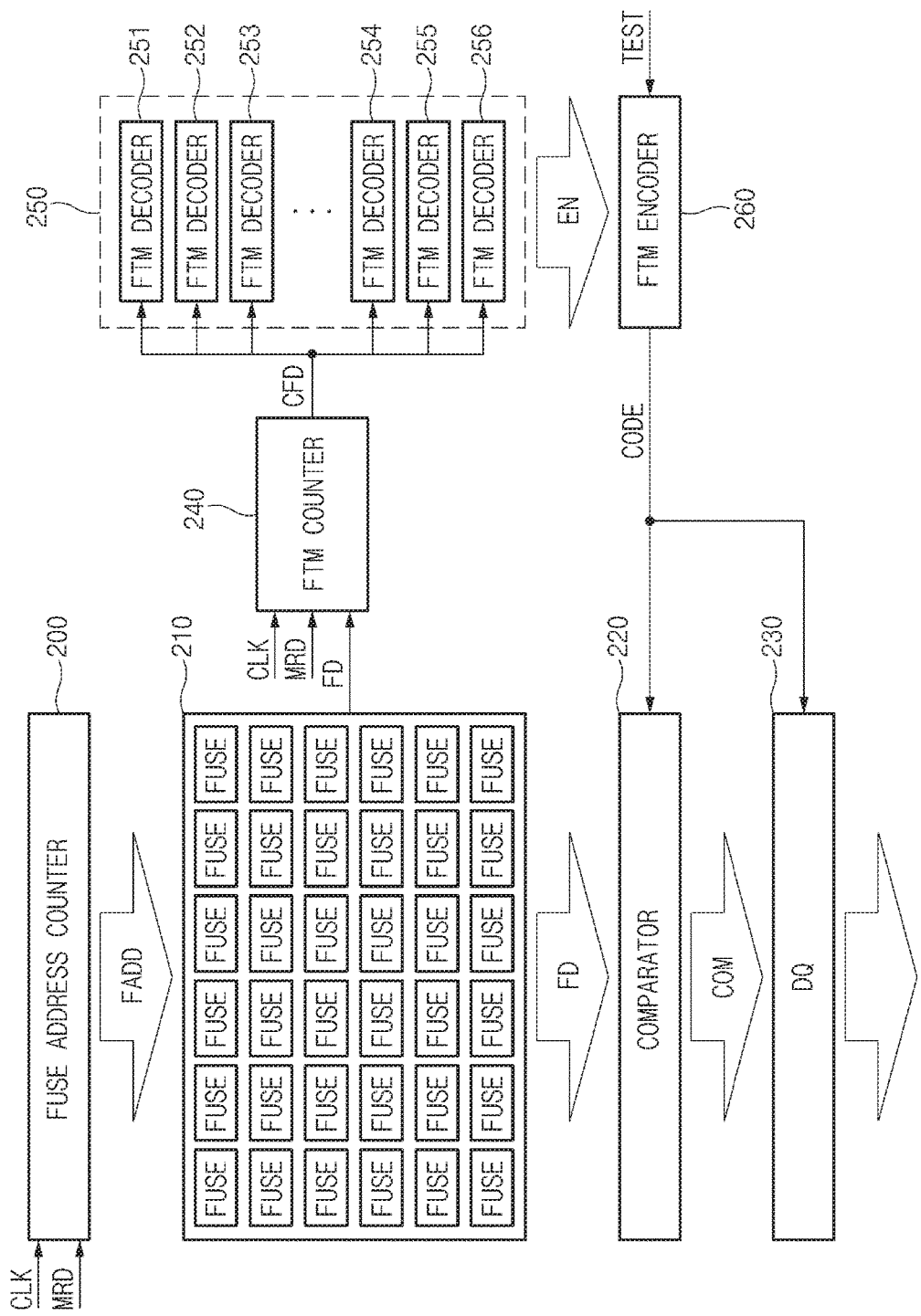
FIG. 2 is a block diagram illustrating a fuse test mode detection device according to an embodiment of the present disclosure.

FIG. 2 is a block diagram illustrating a fuse test mode detection device according to an embodiment of the present disclosure.

Referring to FIG. 2, the fuse test mode detection device according to an embodiment of the present disclosure may include a fuse address counter 200, a fuse unit 210, a comparator 220, an output pad 230, a counter 240, a decoding unit 250, and an encoder 260.

The fuse address counter 200 may count memory repair data MRD in response to the clock signal CLK, and output a fuse address FADD to the fuse unit 210 in response to the memory repair data MRD and the clock signal CLK. The memory repair data MRD may be used to transmit an address of a defective memory cell.

The fuse unit 210 may include a plurality of fuses (FUSEs). The fuse unit 210 may sequentially scan the fuses (FUSEs) in response to the fuse address FADD, and output fuse data FD. In one embodiment, the fuse unit 210 may scan the fuses (FUSEs) in a boot-up operation.

The fuse data FD may include fuse cutting information programmed in the plurality of fuses (FUSEs). The fuse unit 210 may include an E-fuse array (ARE).

As respective constituent elements of the semiconductor integrated circuit (IC) device become super-miniaturized in size and the number of elements contained in one semiconductor chip rapidly increases, the level of defect density also increases.

The increasing defect density may directly deteriorate a production yield or productivity of the semiconductor devices. If the defect density excessively increases, wafers containing the semiconductor device must be discarded and abandoned.

In order to mitigate the defect density, a redundancy circuit for replacing a defective cell with a redundancy cell has been proposed. The redundancy circuit (or a fuse circuit) may be installed into each row-based line (e.g., word line) and each column-based line (e.g., bit line) of the semiconductor memory device.

The redundancy circuit may include an ARE configured to store address information of a defective cell. The ARE may include a plurality of fuse sets, each of which includes a plurality of fuse lines. The ARE is memory that stores information of respective bits of all failed addresses therein.

The ARE may select the corresponding row line in response to the address indicating fuse selection information. Respective fuse-sets are configured to perform information programming by causing an overcurrent to melt a fuse.

It may be necessary for the ARE used in the semiconductor device to perform a boot-up operation in which fuse information must be read prior to the ARE operation. That is, the semiconductor device must be booted up during a specific time after completion of the power-up operation. In this case, the fuse information may include either address information or other information. The address information may be used in the repair operation of the memory cell, and the other information may be defined through various test operations.

In order to employ setting data stored in the fuse unit 210 needed to enable respective decoders (251~256) of the decoding unit 250, fuse unit 210 data must be read and scanned when the memory device is initialized, and this read and scan operation will hereinafter be referred to as the boot-up operation.

The comparator 220 may compare the fuse data FD received from the fuse unit 210 with the code signal CODE received from the encoder 260, and output a comparison signal COM to the output pad 230.

In this case, the comparison signal COM may be determined by matching the fuse data FD with information regarding the code signal CODE. In addition, the comparison signal COM applied to the output pad 230 may be output by the output pad 230 to the external part.

For example, the comparator 220 may compare the fuse data FD with the code signal CODE, and output the comparison signal COM at a high level when the fuse data FD is identical to the code signal CODE. Therefore, if the comparison signal COM is output at a high level through the output pad 230, this means that the FTM is operating normally.

In contrast, if the fuse data FD is different from the code signal CODE, the comparator 220 may output the comparison signal COM at a low level. Therefore, if the comparison signal COM is output at a low level through the output pad 230, this means that the FTM malfunctioned.

The counter 240 may count the fuse data FD received from the fuse unit 210 in response to the clock signal CLK and, in one embodiment, the memory repair data MRD. The counter 240 may output the counted fuse data CFD to the decoding unit 250. The output of counted fuse data CFD may be changed whenever the clock signal CLK is toggled. In this case, the counter 240 may count the fuse data FD during the fuse test mode (FTM).

In addition, the decoding unit 250 may include a plurality of FTM decoders (251~256) configured to output the decoding signals upon receiving the output signal of the counter 240. FTM decoders (251~256), also known as internal decoders, contained in the decoding unit 250 may be sequentially enabled, or selectively enabled, in response to the counting signal received from the counter 240, and in one example, memory repair data.

Addresses and data needed to selectively enable the FTM decoders (251~256) may be established in each fuse (FUSE).

The decoding unit 250 may output the enable signal EN to the encoder 260. The enable signal EN may indicate enable information of the decoders (251~256). That is, if the decoding unit 250 enters a specific test mode (e.g., the roll call test mode) so that the test signal TEST is activated, state information regarding the enabled decoder from among the plurality of decoders (251~256) may be sequentially applied to the encoder 260.

For example, a repair process of the semiconductor device having the fuse unit 210 may be performed using the programming scheme by cutting the electrical fuse (FUSE). In other words, the fuse (FUSE) coupled to the defective memory cell is selectively disabled such that a signal delivery path coupled to the defective memory cell is cut off and coupled to the corresponding redundant memory cell, such that the repair process is carried out.

Unexpected defective parts may occur in the repair process. For example, the fuse (FUSE) may be abnormally cut or another fuse (FUSE), which was not intended to be cut, may be wrongly blown or cut. Accordingly, after completion of the repair process, a roll call test is carried out to determine whether the fuse cutting was performed normally.

In this case, the roll call test may compare the actually repaired address information with legacy address information to be repaired so that the roll call test can detect a defective repaired fuse. Whether a fuse repair is defective may be based on whether the actually repaired address information is identical to the legacy repair address information. If the actually repaired address information is different from the legacy repair address information, this situation will be referred to as a roll call mismatch.

The operation state of the semiconductor memory device may be changed in response to the output signal of the decoding unit 250, such that the test operation is achieved. The operation state of the semiconductor memory device may be changed through the fuse test mode (FTM) controlled by the fuse unit 210. In this case, it is necessary to confirm whether or not a user desired fuse test mode (FTM) operated correctly.

The output signals of respective decoders (251~256) are applied to the physical circuit contained in the memory device configured to control the fuse test mode (FTM) such that a corresponding test operation is carried out. That is, the decoding signals generated from the respective decoders (251~256) may be used to decide which one of the plurality of setup circuits will be enabled and tested.

Test data corresponding to each setup circuit may be stored in each fuse (FUSE) of the fuse unit 210. That is, each setup circuit may be selectively enabled in response to cutting information (CUT/No-CUT) of each fuse (FUSE) such that desired target setup circuits can be tested.

Respective setup circuits may be configured to perform different test operations according to the enable states of the respective decoders (251~256).

For example, if the decoder 251 from among the plurality of decoders (251~256) is enabled, an operation for testing speed characteristics may be performed. If the decoder 252 is enabled, a test operation for changing the amount of a current may be performed.

In addition, if the decoder 253 is enabled, a test operation for changing a timing margin of the internal operation (e.g., the read or write operation) may be performed. In addition, if the decoder 254 is enabled, an operation for testing a level of a core voltage VCORE used in the memory device may be performed. In addition, if the decoder 255 is enabled, a test operation for changing a latency value may be performed.

In addition, if the decoder 256 is enabled, memory capacity can be reduced through the test mode. In other words, assuming that many cells failed and all the failed cells cannot be replaced with redundancy cells, cell capacity is reduced through the test mode without using the corresponding cell. Accordingly, products having reduced cell capacity can be commercially manufactured and introduced to the market. For example, if several cells failed in a DRAM having a size of 8 Gigabits (G bits), the test mode is enabled by the decoder 256 such that a DRAM having such failed cells may operate as a device having a size of 4G bits. The 4G size may correspond to the pass region.

As described above, various test operations may be sequentially carried out through the FTM. If an optimum setup value is searched for through the above test mode in a fabrication process of the memory device and if the optimum setup value is then detected, the detected setup value may be stored and fixed in a fuse circuit.

The encoder 260 may receive fuse test mode enable information in the form of an enable signal EN, indicating enable information of the decoders (251~256), from the decoding unit 250. In an embodiment, the fuse test mode enable information is sent in response to the test signal TEST. The encoder 260 may encode the enable signal EN, and convert the enable signal EN into the code signal CODE.

In other words, the code signal CODE may indicate which fuse test mode was set by the plurality of decoders (251~256).

In addition, the encoder 260 may output the code signal CODE indicating the enabled FTM to at least one of the comparator 220 and the output pad 230. In one example, the encoder 260 outputs the code signal CODE when a specific FTM is tested. That is, the code signal CODE generated from the encoder 260 may be applied to the comparator 220, such that the code signal CODE may be compared with the fuse data FD or may be immediately output to the external part through the output pad 230. In one example, the code signal CODE is output to the comparator 220 when the test signal TEST is activated.

The scheme used in the embodiment may be classified into a first scheme for immediately outputting the code signal CODE to the external part through the output pad 230, and a second scheme for comparing the code signal CODE generated from the encoder 260 with the fuse data FD using the comparator 220.

The first scheme in which the code signal CODE is immediately output to the external part through the output pad 230 will hereinafter be described in detail.

The code signal CODE of the FTM enabled in the boot-up operation may be sequentially output through the output pad 230 during the boot-up operation. If a monitoring unit located outside confirms the code signal CODE generated through the output pad 230 and an FTM malfunction occurs, memory repair data MRD applied to the counter 240 may be controlled.

That is, information corresponding to a fuse address for testing is directly input to the counter 240, such that the corresponding decoder from among the decoders (251~256) contained in the decoding unit 250 may be enabled or disabled.

The second scheme in which the comparator 220 compares fuse data FD with the code signal CODE will hereinafter be described in detail.

The second case in which the comparator 220 compares the fuse data FD with the code signal CODE may be used as a mode for determining whether or not a specific FTM is normal. If the test signal TEST is activated in a specific test mode, the counter 240 may be controlled through memory repair data MRD.

In this case, a specific FTM decoder is confirmed from among the decoding signals received by the decoding unit 250. The FTM decoder is enabled such that the selected code signal CODE may be output to the comparator 220. The comparator 220 may determine whether fuse data FD is identical to the corresponding code signal CODE, such that the determined result may be output to the external part through the output pad 230.

Therefore, embodiments of the present disclosure output FTM information to the external part during a boot-up operation of the semiconductor memory device, and monitor the FTM information during the boot-up operation. As a result, although a malfunction or faulty operation may occur in the semiconductor memory device, the malfunction or faulty operation can be corrected.

For example, if the malfunction or faulty operation occurs in the FTM, memory repair data MRD input to the counter 240 is controlled, such that a corresponding FTM decoder of the decoding unit 250 may be selectively enabled or disabled.

As is apparent from the above description, embodiments of the present disclosure can output test mode information of the fuse unit in such a manner that a user located outside the fuse test mode detection device can monitor the test mode information, resulting in increased efficiency of a fuse test.

Those skilled in the art will appreciate that the invention may be carried out in other specific ways than those set forth herein without departing from the spirit and essential characteristics of the invention. The above embodiments are therefore to be construed in all aspects as illustrative and not restrictive. The scope of the invention should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within a scope of the disclosure, the drawings and the accompanying claims. In addition to variations and modifications in the component parts and/or arrangements, alternative uses will also be apparent to those skilled in the art.

What is claimed is:

1. A device for detecting test mode using a fuse comprising:
   a fuse unit configured to sequentially scan a plurality of fuses in a boot-up operation, and output fuse data;
   a counter configured to count the fuse data in response to a clock signal;
   a decoding unit configured to output a decoding signal for controlling a fuse test mode in response to an output signal of the counter;
   an encoder configured to encode the output signal of the decoding unit, and output a code signal; and
   a comparator configured to compare the fuse data with the code signal, and output a comparison signal.

2. The device for detecting test mode using a fuse according to claim 1, further comprising:
   a fuse address counter configured to output a fuse address to the fuse unit in response to the clock signal and memory repair data.

3. The device for detecting test mode using a fuse according to claim 1, wherein the fuse unit includes an E-fuse array (ARE).

4. The device for detecting test mode using a fuse according to claim 1, wherein the counter is configured to perform a counting operation in response to memory repair data during a test mode.

5. The device for detecting test mode using a fuse according to claim 4, wherein the decoding unit is designed such that an internal decoder is selectively enabled in response to an output signal of the counter.

6. The device for detecting test mode using a fuse according to claim 1, wherein the decoding unit is selectively enabled in response to an output signal of the counter when receiving memory repair data.

7. The device for detecting test mode using a fuse according to claim 1, wherein the decoding unit includes a plurality of decoders configured to control the fuse test mode.

8. The device for detecting test mode using a fuse according to claim 7, wherein the plurality of decoders is sequentially enabled.

9. The device for detecting test mode using a fuse according to claim 7, wherein:
    if a first decoder from among the plurality of decoders is enabled, an operation for testing speed characteristics is performed.

10. The device for detecting test mode using a fuse according to claim 7, wherein:
    if a second decoder from among the plurality of decoders is enabled, a test operation for changing the amount of a current is performed.

11. The device for detecting test mode using a fuse according to claim 7, wherein:
    if a third decoder from among the plurality of decoders is enabled, a test operation for changing a timing margin is performed.

12. The device for detecting test mode using a fuse according to claim 1, wherein the encoder encodes fuse test mode information enabled in response to the output signal output by the decoding unit, and outputs the encoded fuse test mode information as the code signal.

13. The device for detecting test mode using a fuse according to claim 1, wherein the encoder is configured to receive fuse test mode enable information of the decoding unit in response to a test signal.

14. The device for detecting test mode using a fuse according to claim 1, wherein the encoder outputs the code signal to either the comparator or an output pad in response to a test signal.

15. The device for detecting test mode using a fuse according to claim 1, wherein the encoder is configured to output the code signal to the comparator when a specific one fuse test mode is tested.

16. The device for detecting test mode using a fuse according to claim 1, further comprising:
    an output pad configured to output the comparison signal received from the comparator to an external part.

17. The device for detecting test mode using a fuse according to claim 1, wherein the code signal is sequentially output through an output pad during the boot-up operation.

18. The device for detecting test mode using a fuse according to claim 1, wherein the encoder is configured to output the code signal to the comparator when a specific test signal is activated.

19. A method device for detecting test mode using a fuse, the method comprising:
    sequentially scanning, by a fuse unit, a plurality of fuses in a boot-up operation and outputting fuse data;
    counting, by a counter, the fuse data in response to a clock signal;
    outputting, by a decoding unit, a decoding signal for controlling a fuse test mode in response to an output signal of the counter;
    encoding, by an encoder, the output signal of the decoding unit and outputting a code signal; and
    comparing, by a comparator, the fuse data with the code signal and outputting a comparison signal.

* * * * *